(12) United States Patent
Melanson

(10) Patent No.: US 7,194,036 B1
(45) Date of Patent: Mar. 20, 2007

(54) DIGITAL DATA PROCESSING CIRCUITS AND SYSTEMS WITH DELTA-SIGMA MODULATOR FILTERING

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/397,540

(22) Filed: Mar. 26, 2003

Related U.S. Application Data

(63) Continuation-in-part of application No. 10/151,322, filed on May 20, 2002.

(51) Int. Cl.
*H04B 14/06* (2006.01)
*H03M 3/02* (2006.01)

(52) U.S. Cl. ..................... 375/247; 341/143
(58) Field of Classification Search ............... 375/242, 375/247, 316, 245; 341/143, 110, 144
See application file for complete search history.

(56) References Cited

U.S. PATENT DOCUMENTS

| | | | | |
|---|---|---|---|---|
| 5,471,209 A * | 11/1995 | Sutterlin et al. | ............ | 341/143 |
| 5,760,722 A * | 6/1998 | Harris et al. | ................ | 341/143 |
| 5,825,253 A * | 10/1998 | Mathe et al. | ................. | 331/18 |
| 5,949,361 A * | 9/1999 | Fischer et al. | ............. | 341/143 |
| 5,982,315 A * | 11/1999 | Bazarjani et al. | ........... | 341/143 |
| 6,005,505 A * | 12/1999 | Linz | ........................... | 341/143 |
| 6,057,792 A * | 5/2000 | Eastty et al. | ................ | 341/143 |
| 6,061,008 A * | 5/2000 | Abbey | ........................ | 341/143 |
| 6,326,912 B1 * | 12/2001 | Fujimori | ..................... | 341/143 |
| 6,340,940 B1 * | 1/2002 | Melanson | ................... | 341/143 |
| 6,396,428 B1 * | 5/2002 | Cheng | ........................ | 341/143 |
| 6,522,277 B2 * | 2/2003 | Fujimori et al. | ............ | 341/144 |
| 6,590,943 B1 * | 7/2003 | Ali | ............................. | 375/332 |
| 7,062,340 B2 * | 6/2006 | Melanson | ..................... | 700/94 |
| 2002/0122544 A1 * | 9/2002 | Williams et al. | ....... | 379/207.02 |
| 2002/0140589 A1 * | 10/2002 | Bazarjani | .................... | 341/143 |

OTHER PUBLICATIONS

Norsworthy et al., Delta Sigma Data Converters, 1997, pp. 180-181, IEEE Press, Piscataway, NJ.
Proakis et al., Digital Signal Processing, 1996, pp. 682-683, Prentice Hall, Upper Saddle River, NJ.

* cited by examiner

*Primary Examiner*—Young T. Tse
(74) *Attorney, Agent, or Firm*—James J. Murphy; Thompson & Knight LLP

(57) ABSTRACT

A method of processing a digital data stream in a digital processing system includes filtering the digital data stream being processed through a delta-sigma modulator having a selected signal transfer function passing a frequency band of interest.

28 Claims, 6 Drawing Sheets

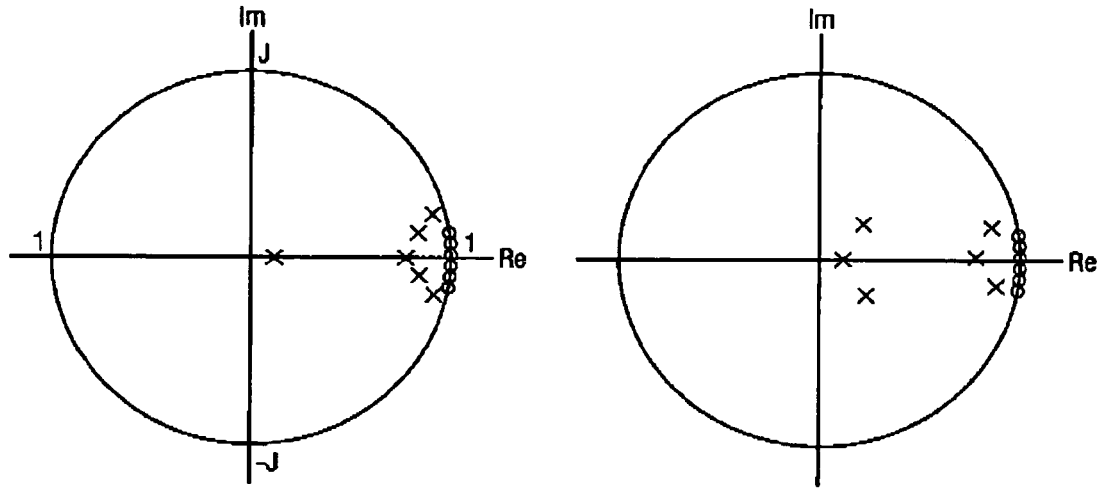
FIG. 4A  FIG. 4B
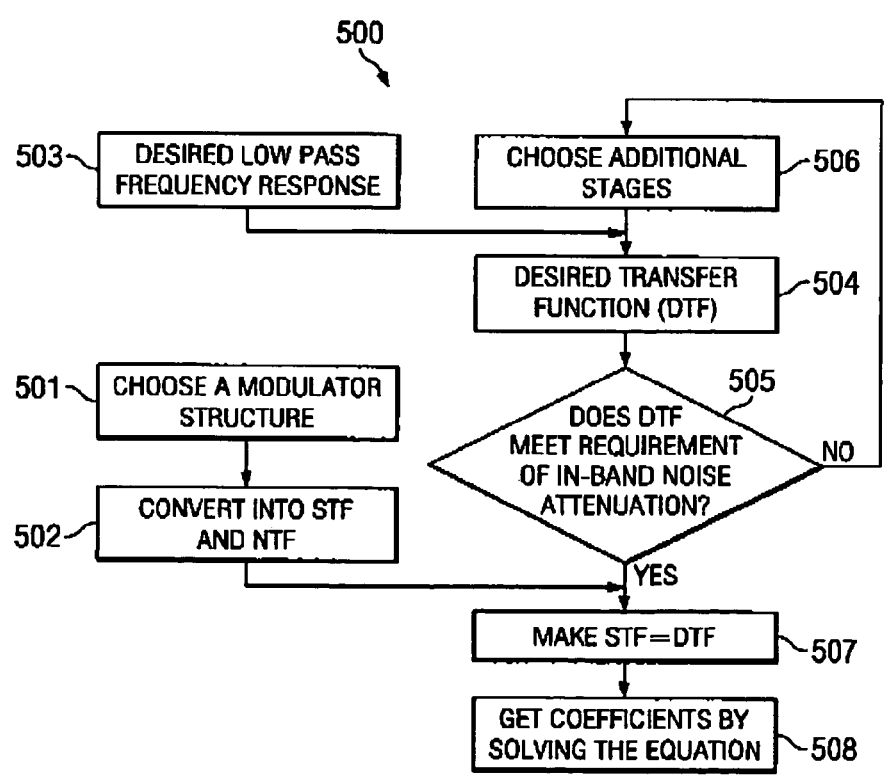
FIG. 5

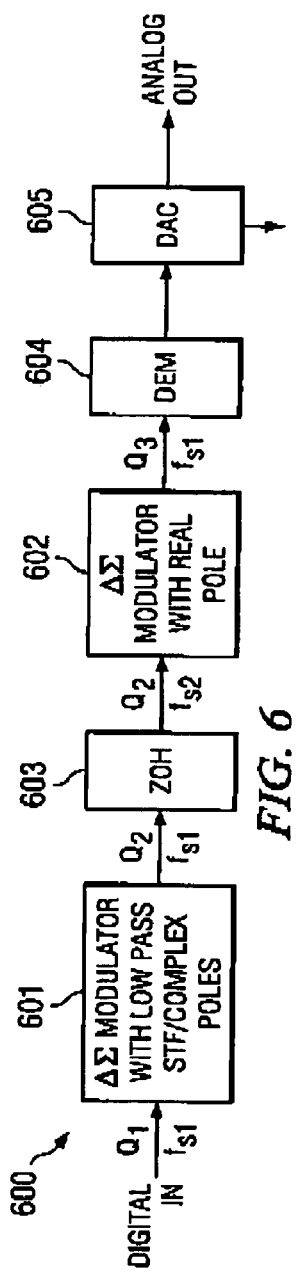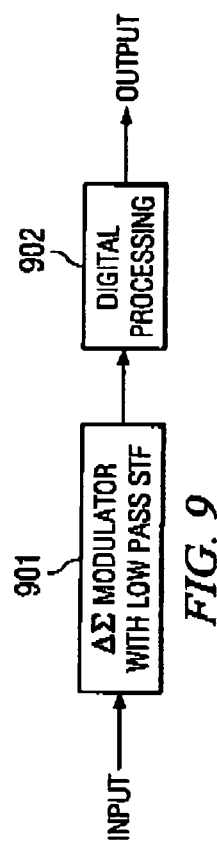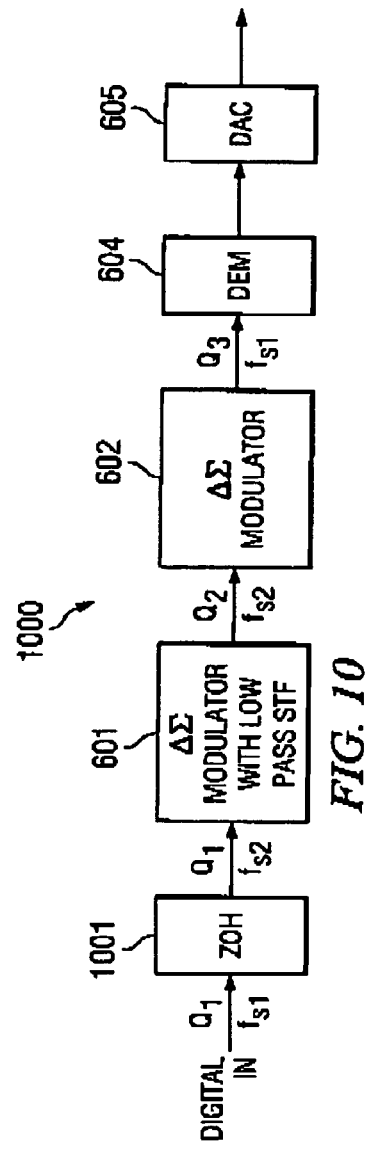

DIGITAL DATA PROCESSING CIRCUITS AND SYSTEMS WITH DELTA-SIGMA MODULATOR FILTERING

CROSS REFERENCE TO RELATED APPLICATIONS

This application for patent is a continuation-in-part of:
U.S. patent application Ser. No. 10/151,322, filed May 20, 2002 by Melanson and Yi entitled "DELTA-SIGMA MODULATORS WITH INTEGRAL DIGITAL LOW-PASS FILTERING.", currently pending.

BACKGROUND OF THE INVENTION

1. Field of the Invention

The present invention relates in general to delta sigma modulators and, in particular, to digital data processing circuits and systems with delta-sigma modulator filtering.

2. Description of the Related Art

Delta-sigma modulators are particularly useful in digital to analog and analog to digital converters (DACs and ADCs). Using oversampling, the delta-sigma modulator spreads the quantization noise power across the oversampling frequency band, which is typically much greater than the input signal bandwidth. Additionally, the delta sigma modulator performs noise shaping by acting as a lowpass filter to the input signal and a highpass filter to the noise; most of the quantization noise power is thereby shifted out of the signal band.

The typical delta sigma modulator-based DAC includes a summer summing the input signal with negative feedback, a linear filter, a quantizer which driving the feedback loop, and a DAC generating the analog signal from the quantizer output. In a first order modulator, the linear filter comprises a single integrator stage while the linear filter in a higher order modulator comprises a cascade of a corresponding number of integrator stages. The quantizer can be either a one-bit or a multiple-bit quantizer. Higher-order modulators have improved quantization noise transfer characteristics over those of lower order modulators, although stability becomes a critical factor as the order increases.

Some applications, such as Super Audio Compact Disc (SACD) one-bit audio, are subject to significant out-of-band noise and therefore require either an external analog filter at the modulator output or an internal digital decimation filter. The analog filtering approach is expensive to implement with high accuracy and adds complexity to the overall design. Also, expensive precision components are required to obtain the Q factor defining the required flatness of the filter response in the proximity of the corner frequency. Digital filtering eliminates the problems of designing and building analog filters, but at the expense of significantly increased computational intensity.

Hence, some other technique is required if cost and simplicity are target design goals for delta sigma modulator data converters for use in applications with significant out-of-band noise.

SUMMARY OF THE INVENTION

The principles of the present invention are generally embodied in circuits, systems, and methods in which the signal transfer function of a delta-sigma modulator is advantageously utilized as a filter in a general digital processing system. According to one particular embodiment, a method is disclosed for processing a digital data stream in a digital processing system and includes filtering the digital data stream being processed through a delta-sigma modulator having a selected signal transfer function passing a frequency band of interest.

In other particular embodiments, a filter, such as a second delta-sigma modulator, which removes quantization noise generated by the delta-sigma modulator follows the output of the delta-sigma modulator. The delta-sigma modulator preferably has a simple topology utilizing all complex poles. The following filter stage therefore also has a simple topology, such as a topology using one real pole. When two delta-sigma modulators are used in series in accordance with the inventive principles, the quantization of the second modulator can be optimized to reduce the size and complexity of the following digital processing stage or stages.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A and 4B are plots in the z-plane of the poles and zeros of the noise transfer function for two exemplary embodiments of delta-sigma data converters according to the present invention;

FIG. 5 is a flow chart illustrating a procedure for designing a noise-shaper with integral signal filtering for a delta-sigma data converter according to the inventive concepts;

FIG. 6 is a block diagram of a further exemplary delta-sigma data converter suitable for use in the digital to analog converter of FIG. 1;

FIG. 9 is a block diagram of a generalized digital processing system utilizing a delta-sigma modulator filter according to the inventive principles; and FIG. 10 is a block diagram of a digital to analog converter having a delta-sigma modulator filter with a variable signal transfer function corner frequency according to the inventive principles.

DESCRIPTION OF THE PREFERRED EMBODIMENTS

The principles of the present invention and their advantages are best understood by referring to the illustrated embodiment depicted in FIGS. 1 to 10 of the drawings, in which like numbers designate like parts.

Figure 1:
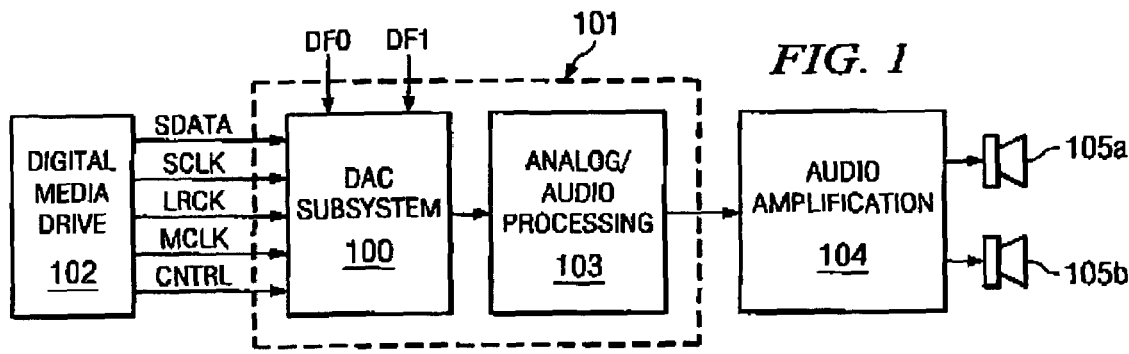
FIG. 1 is a high level block diagram of a representative Super-Audio Compact Disc audio system demonstrating a use of the digital to analog converter of FIG. 2 according to the present invention.

FIG. 1 is a diagram of a typical system application of a one bit digital-to-analog converter (DAC) 100 according to the principles of the present invention. In this example, DAC subsystem 100 forms part of an audio component 101, such as a compact disk (CD) player, digital audio tape (DAT) player, or digital video disk (DVD) unit. A digital media drive 102 recovers the digital data, such as for example 1-bit audio data in the Sony/Philips 1-bit format, from the given digital data storage media, and passes those data, along with clocks and control signals, to DAC subsystem 100. The resulting analog/audio data undergoes further processing in analog/audio processing block 103 prior amplification in audio amplification block 104. Audio amplification block 104 then drives a set of conventional speakers 105a and 105b, a headset, or the like.

Multi-bit digital audio data is received serially as words through the SDATA pin, and serial interface/format selector 101 is timed by the sampling serial clock (SCLK). The left and right channel data are alternately processed in response to the left-right clock (LRCK). The LRCK clock is normally at the same rate as the data input rate (i.e., the sampling rate). Control signals DF1 and DF0 allow for the selection of the input format, such as right or left justified, such as a 20-bit or 24-bit word width. When 1-bit data is being input, the SDATA port receives left channel data and the DF1 port right channel data.

Figure 2:
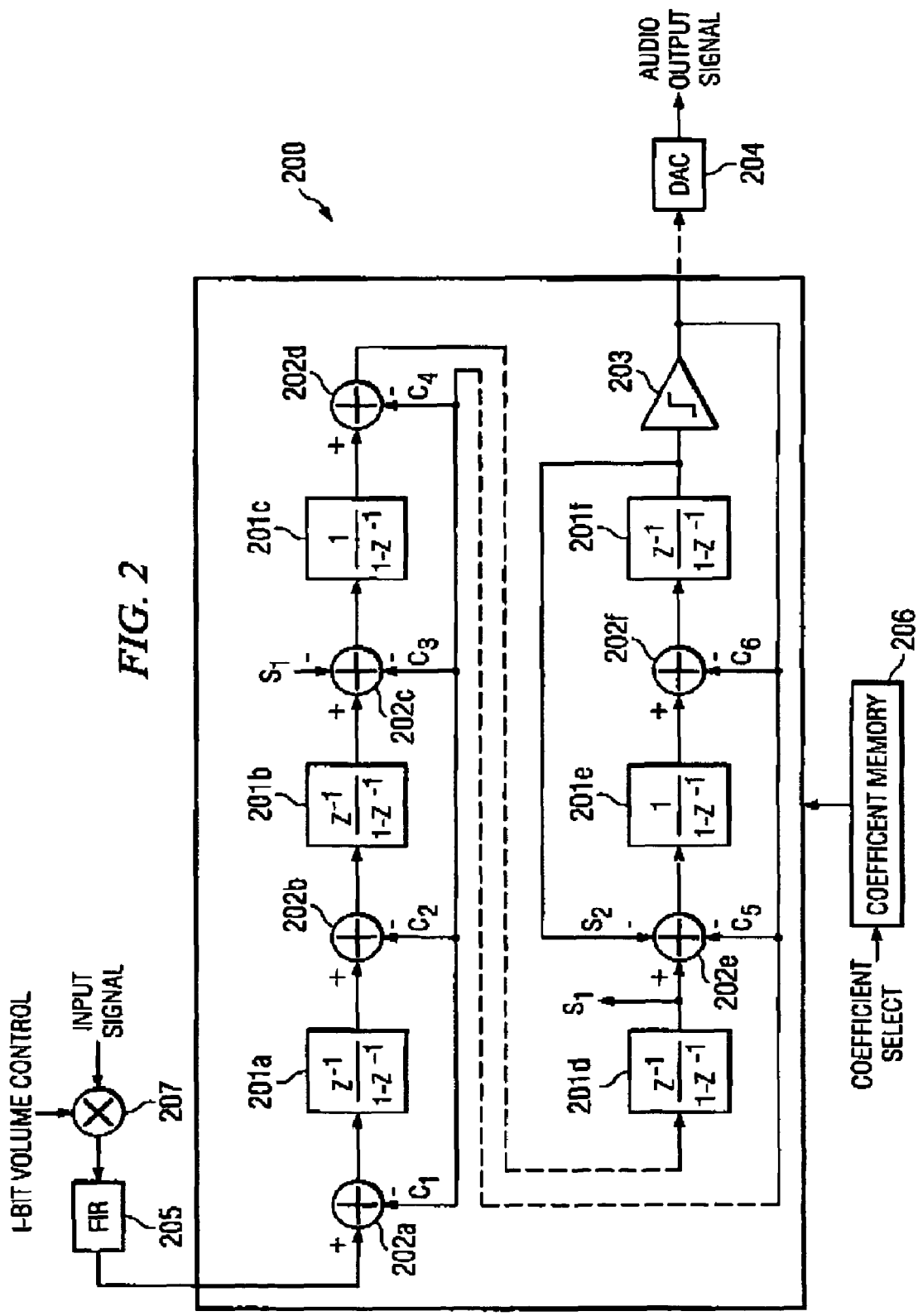
FIG. 2 is a block diagram of an exemplary delta-sigma data converter suitable for use in the digital analog to converter of FIG. 1.

FIG. 2 is an exemplary sixth ($6^{th}$) order distributed-feedback delta-sigma modulator 200 based on six (6) integrator stages 201a–201f and associated summers 202a–202f and two local resonator feedback loops. The loop-filter equations and corresponding noise transfer function ("NTF") and signal transfer function ("STF") for this type of modulator, as well as for alternate configurations suitable for practicing the inventive principles, can be derived from the discussions of Norsworthy et al, *Delta-Sigma Converters, Theory, Design and Simulation*, IEEE Press (1997).

Quantizer 203 quantizes the modulated signal from the final integrator stage 201f. Quantizer 203 is typically a multiple-bit quantizer. The quantized data in turn drive a high-speed, low-resolution output DAC 204, such as a sixteen (16)-level DAC, which generates the analog audio output signal. The input signal with the input data, such as one-bit audio or PCM data out of an interpolator, can be input directly into first stage 201a of the modulator 200 or through an optional finite impulse response (FIR) filter 205 described further below.

Typical delta sigma modulators are designed with a noise transfer function ("NTF") for optimizing the noise shaping response described above. The associated signal transfer function ("STF") is set to approximately unity gain or equalized or worked around elsewhere in the circuit. Normally, sufficient out-of-band gain is selected to drive in-band noise down to an acceptable level, typically 10 dB below the analog noise. The present inventive concepts, however, utilize the advantage of the STF for filtering out-of-band noise in the input signal.

For discussion purposes, one-bit audio data is assumed to be processed at a 128*44100 Hz (5.6448 MHz) oversampling rate. Based on this assumption, the following exemplary filter coefficients, noise transfer functions ("NTFs"), and signal transfer functions (STFs") were developed. The data rate, the filter coefficients, and the transfer functions may vary from embodiment to embodiment without deviating from the inventive concepts. Moreover, the order and/or the configuration of the delta sigma modulator may vary from the preferred embodiment shown in FIG. 2. (For example, a feedforward or other known delta-sigma modulator architectures may alternatively be used).

If a 50 kHz filter were used for the STF, then the NTF would have insufficient in-band noise attenuation. Therefore, in modulator 200, the coefficients are selected to implement a STF filter with 50 kHz $5^{th}$ order Butterworth low pass poles and an additional pole at approximately 600 kHz. (See FIGS. 4A and 4B). (The characteristics of Butterworth low pass filters are described in most texts on digital signal processing, such as Proakis et al., *Digital Signal Processing Principles, Theory and Applications*, Prentice Hall, (1996)). The 600 kHz pole ensures that the NTF noise attenuation in the low pass band is sufficiently high. The coefficients for this embodiment are shown in Table 1:

TABLE 1

FEEDBACK COEFFICIENTS

| Coefficient | $5^{th}$ Order Butterworth Poles, 50 kHz corner, 128 fs, fs = 44.1 kHz, Additional Pole at 600 kHz |
|---|---|
| C1 | $2.51692 \times 10^{-7}$ |
| C2 | 0.0000152454 |
| C3 | 0.00042963 |
| C4 | 0.00811408 |
| C5 | 0.0994375 |
| C6 | 0.595056 |

Figure 3A:
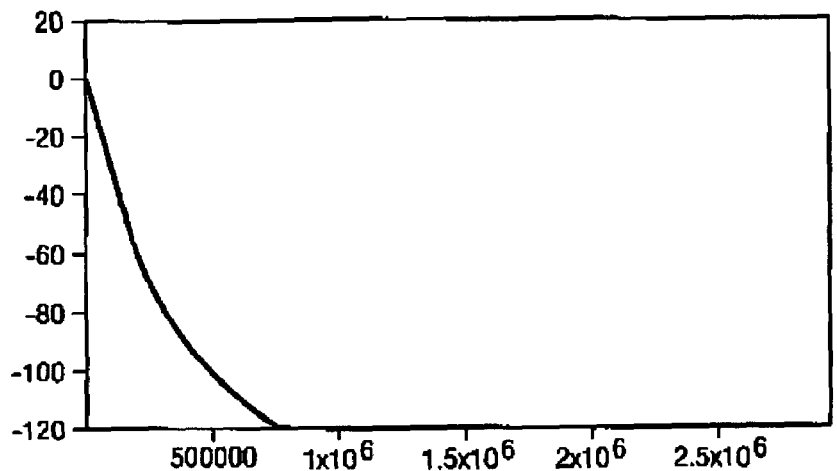
FIGS. 3A–3D are plots of the signal and noise transfer functions for the delta-sigma data converter of FIG. 2 for selected sets of coefficients and selected orders.
Figure 3B:
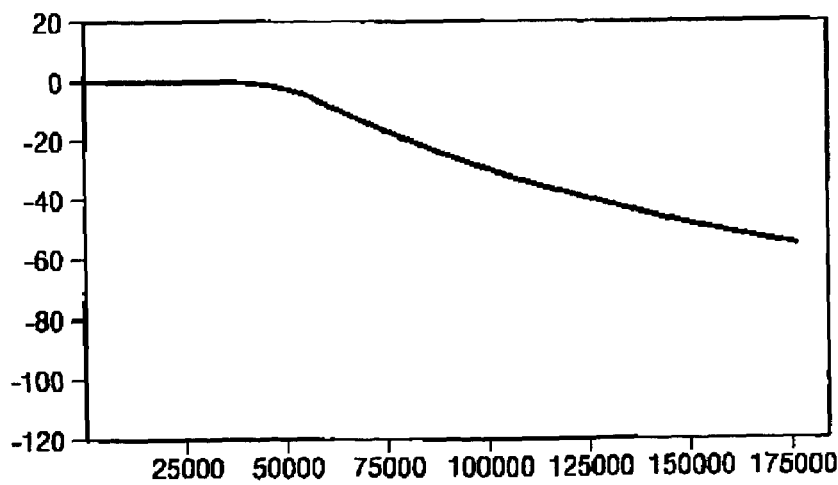
Figure 3C:
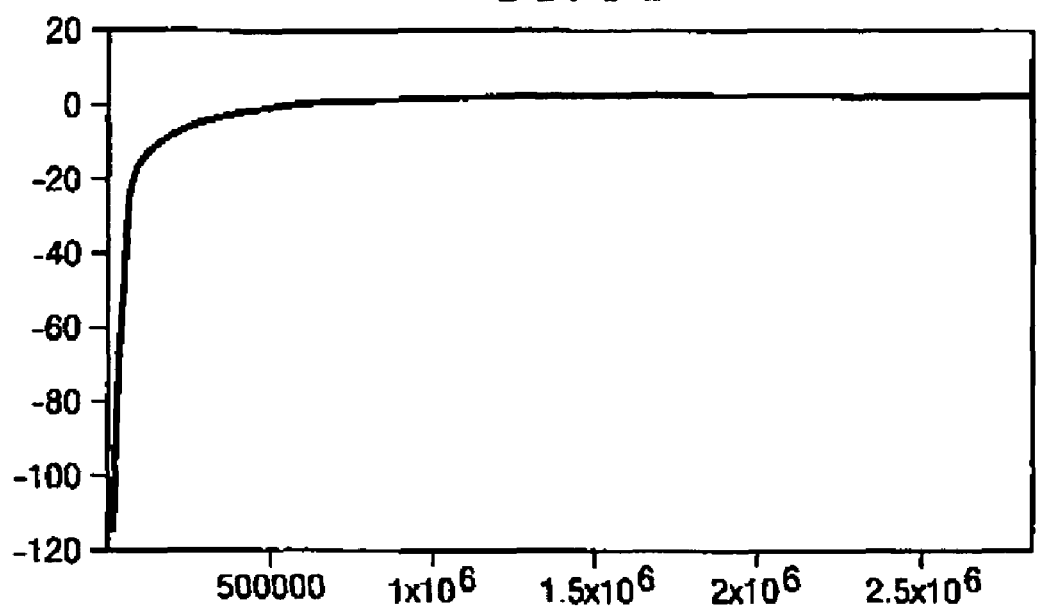
Figure 3D:
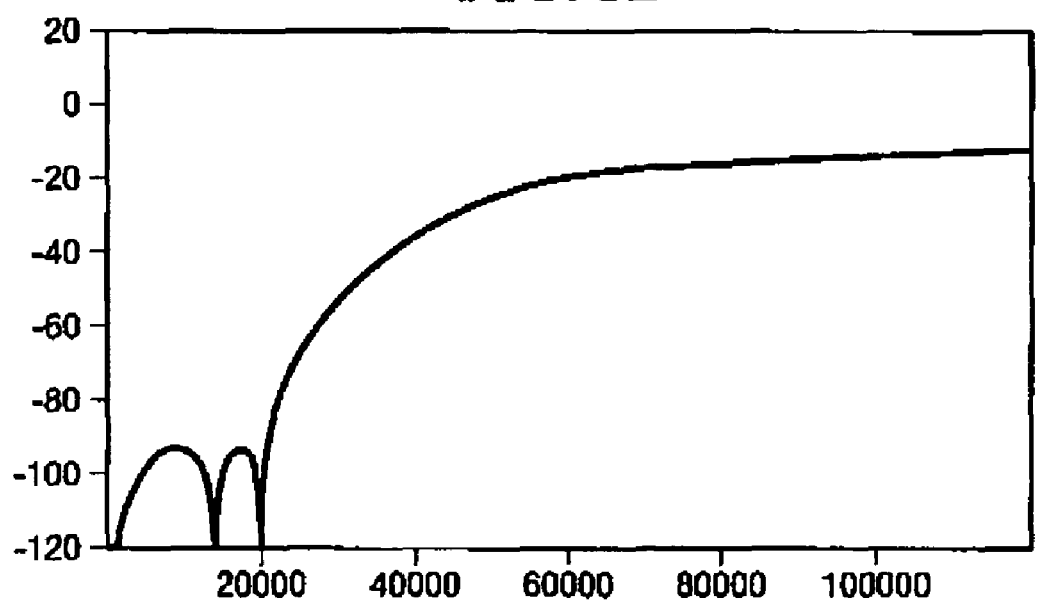

One method of deriving these coefficients is through the Mathmatica® code provided in the appendix. FIGS. 3A–3D are exemplary plots for the NTF and STF generated by this code for the coefficients and constraints of Table 1. Specifically, the signal transfer function is shown in FIGS. 3A and 3B. FIG. 3B is a zoomed-in view of the low frequency signal pass band. As shown, the passband corner is at approximately 50 kHz, and the gain rolls-off relatively quickly thereafter. Similar plots for the NTF are shown in FIGS. 3C and 3D. With respects to the NTF, good noise attenuation is provided in the audio band up to approximately 20 kHz. The modulator structure of FIG. 2, which includes two local resonator feedback loops S1 and S2, results in two zeros in the audio passband.

Referring back to FIG. 2, a non-volatile or volatile memory system 206, or equivalent logic, may be included to support programmability of the modulator coefficient, and hence selectability of the STF pass-band. For example, one set of low-frequency coefficients could be stored for the one-bit audio application, and another set of high-frequency coefficients for 192 kHz PCM applications with a corner frequency around 200 kHz. Multiplexers or similar selector/switching circuitry are utilized for performing the coefficient selection. Additionally, since a change in coefficients may change the scale factors for each stage, a pair of corresponding amplifiers and associated multiplexers are provided in front of each.

Optional FIR 205 may be a simple design with five zeros at the Nyquist frequency. If any additional output filtering is required, a simple analog R-C filter at the data converter output may be utilized. In any event, by embodying the primary filter function in the STF of the delta sigma modulator, the overall system is much less expensive and/or much less computationally intensive.

Additionally, in audio applications, volume control can be implemented with a relatively simple one-bit by n-bit multiplier 207 operating on the one-bit audio data at the front end of the converter.

A plot of the zeros and poles in the z-plane for the NTF in the preferred embodiment is provided in FIG. 4A. The poles of the STF are co-located with those of the NTF and hence have not been separately plotted. According to the inventive principles, two distinct sets of poles are used. For the exemplary sixth ($6^{th}$) order Butterworth filter and the coefficients provided in Table 1, the first pole set, providing the 50 kHz corner frequency and a relatively sharp roll-off, includes one (1) real pole and two complex-conjugate pole pairs and at z=0.945838, 0.981579±0.0520094i, and 0.955454±0.0312881i. The additional pole (second pole set) for increasing the noise attenuation in the signal passband is set at z=0.48497 or approximately 600 kHz. The zeros—of the NTF are generally shown on the unit circle with two of six zeros moved off the real axis by the resonator loops of FIG. 2.

Generally, the first set of poles is selected to set the STF corner frequency (which, in this example is approximately 50 kHz) and the slope (roll-off) at the passband edge of the low-pass signal filter. While one (1) real and two complex pole-pairs are utilized to set the STF characteristics in this example, the number and type of poles can change from embodiment to embodiment. Preferably, the first pole set has at least two poles to define the STF which are preferably complex to obtain a sufficiently sharp passband roll-off. While these poles are at the Butterworth locations, other pole locations (filter functions) and filter types, such as those used to obtain elliptical and Chebyshev functions can alternatively be used.

The second pole or second set of poles is selected to improve the noise shaping function of the NTF, and particularly to increase the noise attenuation within the STF passband as described above. Advantageously, by moving the second set of poles relative to the first set, the NTF can be tuned. In the illustrated embodiment, the second pole set comprises one real pole corresponding to a frequency of at least twice the STF cut-off frequency set by the first pole set (which, in this example, is 600 kHz). Moving this pole outward from the origin in the z-plane by reformulating the coefficient set, and therefore reducing the spacing of the first and second pole will sets, the noise attenuation in the low frequency band. On the other hand, the low frequency band NTF can generally be improved by moving this pole set towards the origin. The illustrated single real pole can be moved to approximately the origin by when the coefficient of the last loop filter stage is approximately one (1).

As previously indicated, numerous alternate arrangements of the poles, as well as the zeros are possible, as illustrated in FIG. 4B. In this case, a sixth ($6^{th}$) order modulator is represented with one real pole. One complex pole-pair set the STF low-response and one real pole and one complex pole-pair set the NTF.

FIG. 5 is a flow chart 500 of a procedure, which along with the code provided in the Appendix, provide a methodology for designing a delta-sigma data converter with integral signal filtering according to the inventive concepts.

Blocks 501 and 502, show steps of a modulator structure being selected and the equations for the corresponding NTF and STF being derived. Exemplary structures and characterizing equations are set out in Norsworthy et al., cited in full above. Again, in the illustrated embodiment, a feedback structure was selected with two resonators; equations for the NTF and STF for this structure are provided in the code set out in the Appendix.

Block 503 shows the step of the desired low frequency response being selected for some initial number of loop-filter stages. From this selection, the initial desired transfer function is selected at block 504, and a determination is made as to whether this transfer function meets the in-band noise attenuation requirements for the signal at block 505. If it does not meet this requirement, then additional loop filter stages are added at block 506.

When the desired transfer function is achieved, the STF is defined to be equivalent to that of the transfer function at block 507. The coefficients are thereafter obtained at Block 508 by solving the equations for the NTF and STF for the selected structure and with the STF defined as the desired transfer function.

FIG. 6 is a block diagram of an alternate delta-sigma data converter 600 embodying the principles of the present invention. In particular, delta-sigma data converter 600 includes a first delta-sigma modulator 601 that generally defines lowpass STF that removes out of band noise from the highly oversampled input signal. In addition, first delta-sigma modulator 601 adds a small amount of in-band and out-of-band noise due to its own quantization and NTF. In the present example, first delta-sigma modulator 601 has a low-pass STF defined by a complex set of poles. A second delta-sigma modulator 602 reduces the number of quantization levels to a level appropriate for the design of DAC 605 (typically 5–65 levels.) In addition, the STF of second delta-sigma modulator 602 may also provide low pass filtering, removing out-of-band noise added by first delta-sigma modulator 601, or remaining from the input signal processed by the STF of 601. A zero-order hold ("ZOH") stage 603 is optionally provided to increase the sample rate out of first delta-sigma modulator 601 and further shift the out-of-band quantization noise to higher frequencies through second delta-sigma modulator 602. As discussed further below, a zero-order hold stage is alternatively disposed at the input of first delta-sigma modulator 601 such that first modulator 601 operates at twice the input over-sampling rate.

In the final output, the noise of the input signal is filtered by the STF of first delta-sigma modulator 601 and the STF of second delta-sigma modulator 602. The noise due to the quantization of the output of the first delta-sigma modulator 601 is filtered by the NTF of first delta-sigma modulator 601, and by the STF of second delta-sigma modulator 602. The noise due to the quantization of the output of second delta-sigma modulator 602 is filtered by the NTF of second delta-sigma modulator 602, as in a typical delta-sigma modulator.

In the preferred embodiment the quantization resolution of first delta-sigma modulator 601 (i.e. the number of output bits or levels) is greater than the quantization resolution of second delta-sigma modulator 602. Consequently, delta-sigma modulator 601 adds very little output noise, while the quantizer of delta-sigma modulator 602 is designed to provide an optimum interface into the following dynamic element matching (DEM) Logic 604 and DAC 605. For example, if the quantizer of second delta-sigma modulator 602 outputs a relatively small number of bits, DEM 604 can be substantially reduced in complexity and/or entirely eliminated. Similarly, the size and complexity of DAC 605 can be reduced for a relatively small number of quantization bits from second delta-sigma modulator.

As shown in FIG. 6, first delta-sigma modulator 601 receives an input stream of a given quantization $Q_1$ and a given oversampling rate $f_{S1}$. In an SACD application, for example, this input stream is an one-bit quantized digital audio data stream with an oversampling rate of $64f_S$. First delta-sigma modulator 601 operates on an and outputs the input data at the $f_{S1}$ rate with a second quantization resolution $Q_2$, such as eight bits at $64f_S$. For embodiments operating on SACD data, the sampling rate is 44.1 kHz.

Figure 7A:
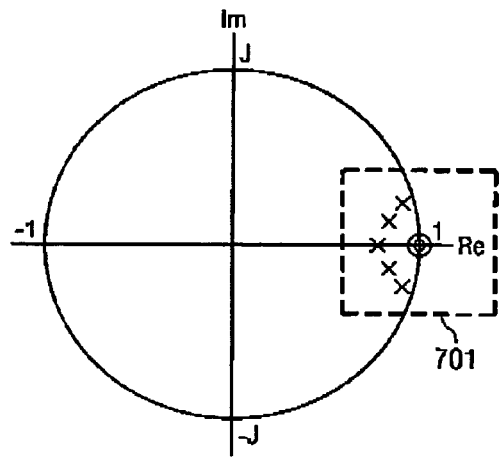
FIGS. 7A and 7B are plots in the z-plane of representative sets of poles and zeros of the noise and signal transfer functions of the delta-sigma data converter of FIG. 6.
Figure 7B:
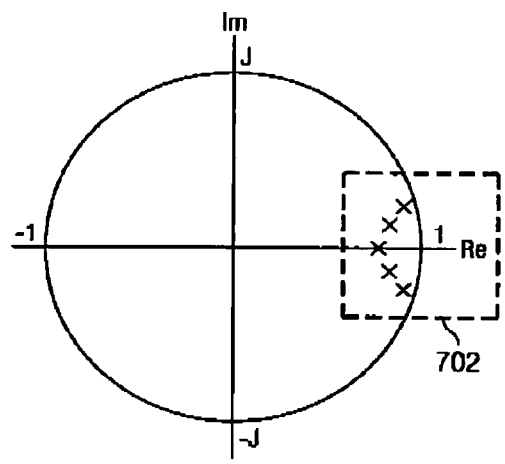

FIGS. 7A and 7B are pole-zero plots on the z-plane respectively of the NTF and STF of exemplary first delta-sigma modulator 601. In the illustrated embodiment, first delta-sigma modulator 601 is a fifth order modulator which generates five Butterworth poles and five co-located zeros at the zero frequency point 0=0) in the data converter NTF as shown generally at area 701 in FIG. 7A. In this example, the NTF zeros are not split which advantageously reduces the amount of hardware required to construct first delta-sigma modulator 601. With respects to the STF shown in FIG. 7B, first delta-sigma modulator 601 generates a set of poles generally as shown at area 702. The number of complex NTF and STF poles and zeros in areas 701 and 702 and their location in the z-plane will vary from embodiment to embodiment depending on such factors as the desired pass band attenuation, steepness of the pass band edge, and the number of loop filter stages. In the embodiment of FIGS. 7A and 7B, the STF poles have been selected to produce a Butterworth response with a corner frequency of approximately 50 kHz at an oversampling rate of $64f_S$.

In the embodiment shown in FIG. 6, ZOH stage 603 inputs data at the second quantization resolution $Q_2$ and the first oversampling rate $f_{S1}$ and outputs data at the second quantization resolution $Q_2$ and a second oversampling rate $f_{S2}$. In the present example, zero order hold ("ZOH") stage 603 inputs 8-bit data at an oversampling rate of $64f_S$ and outputs 8-bit data at a $128f_S$ oversampling rate.

Second delta-sigma modulator 602 preferably inputs data at quantization resolution $Q_2$ and outputs data at a quantization resolution $Q_3$, in which the quantization resolution $Q_2$ is greater than the quantization at $Q_3$. For example, in the illustrated embodiment where 8-bit data is input into second delta-sigma modulator 602, the resulting recoded output may be four bits.

Figure 8A:
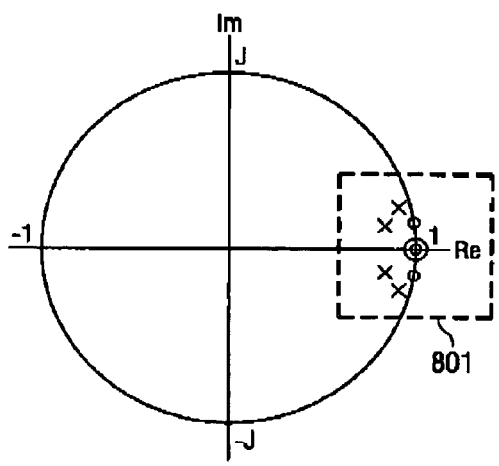
FIGS. 8A and 8B are respective pole-zero plots in the z-plane for the noise and signal transfer functions corresponding to the second delta-sigma modulator of FIG. 6.
Figure 8B:
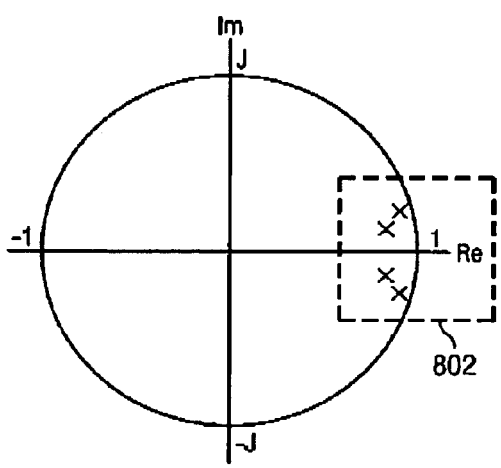

FIGS. 8A and 8B are respectively pole-zero plots in the z-plane of an exemplary NTF and an exemplary STF for second delta-sigma modulator 602. In the exemplary z-plane plot of FIG. 8A, the NTF includes four complex poles, two complex zeros, and two co-located real zeros, shown generally at area 801. The STF shown in FIG. 8B, generally at area 802, includes four complex poles. In the illustrated embodiment, the STF is generally flat or has a low pass response, and the NTF has a zero (0) gain crossover point of approximately 200 kHz at an oversampling rate of $128f_S$. With respect to second delta-sigma modulator 602, the number and location of the poles and zeros in areas 801 and 802 may vary, depending on the desired filtering function and constraints on the size and complexity of the hardware.

The principles of the present invention can be extended beyond data conversion applications. Such an embodiment is generally illustrated in FIG. 9 in which a delta-sigma modulator 901 provides a low pass STF in front of a digital processing block 902. Digital processing block 902 may be another delta-sigma modulator, a digital transmission medium, a digital signal processor (DSP), data compressor, or some other digital processing device. In other words, a delta-sigma modulator 901, having a selected signal transfer function is used as a filter in a general digital system. Exemplary delta-sigma modulators with a STF suitable for use as a filter have been described in detail above.

FIG. 10 illustrates an additional embodiment of the principles of the present invention in which a zero-order hold ("ZOH") stage 1001 is disposed in the data stream in front of first delta-sigma modulator 601. In this embodiment, the sample rate into first modulator 601 is doubled, such as from $64f_S$ to $128f_S$. By increasing or decreasing the sampling rate, by selectively utilizing zero-order hold ("ZOH") stage 1001, the corner frequency of the associated STF is varied while the remaining parameters of first modulator 601 (e.g. the feedback coefficients) remain the same. In the example discussed above, increasing the sampling rate $f_{s1}$ at the input of first delta-sigma modulator 601 from $64f_s$ to $128f_s$ moves the STF corner frequency from approximately 50 kHz to approximately 100 kHz.

Although the present invention and its advantages have been described in detail, it should be understood that various changes, substitutions and alterations can be made herein without departing from the spirit and scope of the invention as defined by the appended claims.

---

APPENDIX

```
In[20]:=
        sdanalyze [ord_, ds_, nz_] :=
            Module [{c0, gg, a, bx, bn, cx, cn, dx, dn, izma, ceq, invm, hnn, hnx,
        afb, bfb},
                (*
                        Analyze a delta sigma topology
                        ord — order
                        ds — ds description function
                        nz — number of complex zero pairs
                        Returns characteristic equation (poles),
                    NTF numerator, STF numerator,
                        state transition matrix for feedback, and b vector for
        feedback
                *)
                co = Table [c[i], {i, ord}]; gg = Table [g[i], {i, nz}];
                a = Transpose [Table[
                    Module [{i=Table[1f[j == k, 1, 0], {k, ord}]},
                        ds[i, 0, 0, co, gg, 0][[1]]]
                        , {j, ord}]];
                bx = Module [{i= Table [0, {ord}]}, ds[i, 1, 0, co, gg, 0] [[1]]];
                bn = Module [{i = Table [0, {ord}]}, ds[i, 0, 1, co, gg, 0] [[1]]];
                cx = cn = Table [Module[{i = Table [If[j== k, 1, 0], {k, ord}]},
                        ds [i, 0, 0, co, gg, 0] [[2]]]
                        , {j, ord}];
                dx = Module [{i = Table [0, {ord}]}, ds[i, 1, 0, co, gg, 0] [[2]]];
                dn = Module [{i = Table [0, {ord}]}, ds[i, 0, 1, co, gg, 0] [[2]]];
                izma = Table [If[j == k, 1, 0], {j, ord}, {k, ord}] - zm*a;
                ceq = Collect [Det [izma], zm];
```

-continued

APPENDIX

```
                hnn = Simplify [dn*ceq+zm* (cn.Table[
                    Simplify [Det[Transpose[ReplacePart[Transpose[izma], bn, i]]]], {i,
ord}])]
                hxn = Simplify [dx*ceq+zm* (cx.Table[Simplify[
                    Det[Transpose[ReplacePart[Transpose[izma], bx, i]]]], {i, ord}])];
                izma = .;
                afb = Transpose[Table[
                    Module [{i = Table[If[j = = k, 1, 0], {k, ord}]},
                        ds[i, 0, 0, co, gg, 1] [[1]]]
                    , {j, ord}]];
                bfb = Module [{i = Table[0, {ord}]}, ds [i, 0, -1, co, gg, 0] [[1]]];
                {ceq, hnn, hxn, afb, bfb}
                ];
In[21]:= solvecoef [fs_, fc_, n_, ceq_, zeros_, sp_] := Module [{lp, pp, ceqc,
bnc},
            (*
                Given a denominator polynomial, solve for the coefficients that give
                a butterworth responsed.
                sample freq,
            corner freq, order, poly in zm, local resonator feedbacks
                *)
                lp[fsl_, fc1_, n1_] := Module [{cp, cp1, pz, r, a1, r1},
            (*
                Make the z transform for a butterworth filter
                fsl — sample rate
                fc1 — corner frequency
                n1 — order
                *)
                cp1 = Together[(1−zm* (1+s1)/(1 − s1)) * (1 − zm * (1 + s2)/(1 − s2))
/.
                    {s1 -> r1*Cos [x] + r*r1*Sin[x], s2 -> r1*Cos [x] − I*r1*Sin[x]}];
                cp = Expand [Numerator[cp1]]/Expand[Denominator[cp1]];
                rp = 1 − 1. * zm + (1 + s1)/(1 − s1)/.s1 -> −r1;
                (*.9999 to flatten freq response*)
                r := N[Tan [fc1/fs1*2*π/2]];
                pz := Product [cp/.x->iπ/(2 n1), {i, n1+1, 2 n1−1, 2}] /; EvenQ[n1];
                pz := Product [cp/.x->iπ/n1, {i, (n1+1)/2, n1−1}] *rp /; OddQ[n1];
                N[Collect[pz/. {r1-> r}, zm]]
                ];
                pp = If[sp = = 1, lp[fs, fc, n], lp[fs, fc*sp, 1] *lp[fs, fc, n−1]];
                ceqc = Flatten[Table[Coefficient[
                ceq/.Table[g[i] -> zeros[[i]], {i, Length[zeros]}], zm^i], {i, n}]];
                bnc = Table[Coefficient[pp, zm^i], {i, n}];
                First[
                Table[c[i], {i, n}]/.Solve[Inner[Equal, ceqc, bnc, List], Table[c[i], {i, n}]]]
];
In[22]: = makeh[den_, num_, coef_, ze_] : = Module[{s1, s2},
                s1 = Table[g[i] -> ze[[i]], {i, Length[ze]});
                s2 = Table[c[i] -> coef[[i]], {i, Length[coef]}];
                Simplify[num/.s1/.s2]/Simplify[den/.s1/.s2]
            ]
In[23]: = patrsp[fs_, ntf_, stf_] := Module[{res, ww, sres},
                res[x_] = ntf/.zm->x; sres[x_] = stf/.zm->x;
                Print["Noise Transfer Function=\n", ntf];
                Print["Signal Transfer Function=\n", stf];
                ww = N[2*π*I/fs];
                Print["Sample Rate= ", fs];
                Print["Nyquest noise gain = ", res [−1]];
                Print["noise reduction to 20k = ",
                    10*Log[10,NIntegrate[Abs[res[Exp[ww*x]]]^2, {x, 20, 20000}]/(fs/2)]];
                Plot[20*Log10, Abs[res[Exp[ww*x]]]], {x, 0, fs/2}, PlotRange -> {−120,
20},
                    GridLines -> Automatic, ImageSize -> 72*5, PlotLabel → "NTF"];
                Plot[20*Log10, Abs[sres[Exp[ww*x]]]], {x, 0, fs/2}, PlotRange -> {−120,
20},
                    GridLines -> Automatic, ImageSize -> 72*5, PlotLabel → "STF"];
                Plot[20*Log10, Abs[res[Exp[ww*x]]]], {x, 0, fs/32}, PlotRange -> {−120,
20},
                    GridLines -> Automatic, ImageSize -> 72*5, PlotLabel → "NTF
ZOOM"];
                Plot [20*Log10, Abs[sres[Exp[ww*x]]]], {x, 0, fs/32}, PlotRange -> {
−120, 20},
                    GridLines -> Automatic, ImageSize -> 72*5, PlotLabel → "STF
ZOOM"];
                ];
In[24]:
                5th Order DSD re-modulator
```

-continued

APPENDIX

```
(*Define the topology of a modulator
ii = starting state (list)
x = input (scalar)
ns = quantization "noise" (scalar)
co = list of coefficients
g = local resonator gains
fb = 1 to close loop, 0 open *)
ds5[ii_, x_, ns_, co_, g_, fb_] := Module [{i0, i1, i2, i3, i4, y},
    i0 = ii[[1]]; i1 = ii[[2]]; i2 = ii[[3]]; i3 = ii[[4]]; i4 = ii[[5]];
    y = If[fb == 1, ns, i4=ns];
    i0 + = (x−y) * co[[1]];
    i1 + = i0 + i2*g[[1]] − y*co[[2]];
    i2 + = i1 − y+co[[3]];
    i3 + = i2+i4*g[[2]] − y*co[[4]];
    i4 + = i3 − y*co[[5]];
    {{i0, i1, i2, i3, i4}, y}       ];
In[25] : = desc5 = sdanalyze[5, ds5, 2];
    g1 = {−1./8192, −1./2048}; (*NTF zeros*)
    fs = 44100*128;
    ctab5 = solvecoef[fs, 50000, 5, desc5[[1]], g1, 1];
    ntf5 = makeh[desc5[[1]], desc5[[2]], ctab5, g1];
    stf5 = makeh[desc5[[1]], desc5[[3]], ctab5, g1] * ((.5+.5*zm)^1);
In[31] :=
        6th Order DSD re-modulator
            ds6[ii_, x_, ns_, co_, g_, fb_] : = Module [{i0, i1, i2, i3, i4, i5,
y},
        i0 = ii[[1]]; i1 = ii[[2]]; i2 = ii[[3]]; i3 = ii[[4]]; i4 = ii[[5]]; i5 = ii[[6]];
        y = If[fb == 1, ns, i5 + ns];
        i4 + = i3 + i5*g[[3]] − y*co[[5]];
        i5 + = i4 − y*co[[6]];
        i2 + = i1 + i3*g[[2]] − y*co[[3]];
        i3 + = i2 − y*co[[4]];
        i1 + = i0 + (−y) * co[[2]];
        i0 + = (x−y) co[[1]] + i1*g[[1]];
        {{i0, i1, i2, i3, i4, i5}, y}          ];
In[32] : = desc6 = sdanalyze[6, ds6, 3];
    gI = {0, −2, ^−12, −2. ^−11); (*NTF zeros*)
    ctab6 = solvecoef[fs, 50000, 6, desc6[[1]], g1, 12];
    ntf6 = makeh[desc6[[1]], desc6[[2]], ctab6, g1];
    stf6 = makeh[desc6[[1]], desc6[[3]], ctab6, g1];
In[37] : = Print ["coefficients = ", ctab5]; patrsp[fs, ntf5, stf5];
    Print ["coefficients = ", ctab6]; patrsp[fs, ntf6, stf6];
    coefficients = {4.88599×10⁻⁷, 0.0000259205, 0.000779239, 0.0138403,
0.164839}
```

$$\text{Noise Transfer Function} = \frac{1.19737(-1+zm)(1-1.99988\ zm+zm^2)(1-1.99951\ zm+zm^2}{(-1.05726+zm)(1.09425-2.091\ zm+zm^2)(1.03498-2.03183\ zm+zm^2)}$$

$$\text{Signal Transfer Function} = \frac{5.85035\times 10^{-7}(0.5+0.5\ zm)zm}{(-1.05726+zm)(1.09425-2.091\ zm+zm^2)(1.03498-2.03183\ zm+zm^2)}$$

Sample Rate= 5644800
Nyquest noise gain = 1.09408
    noise reduction to 20k = −85.2997

What is claimed is:

1. A method of processing a digital data stream in a digital processing system comprising:
    filtering the digital data stream being processed through a first digital delta-sigma modulator having a loop-filter, the first digital delta-sigma modulator implementing a selected signal transfer function for passing data having frequency within a selected frequency band to generate a stream of filtered data quantized to a first number of levels; and
    noise shaping and requantizing the stream of filtered data with a second digital delta-sigma modulator into a stream of requantized multiple-bit filtered data requantized to a second number of levels, the second number of levels being less than the first number of levels and selected for driving following multiple-bit digital processing circuitry.

2. The method of processing of claim 1, wherein filtering the digital data stream comprises filtering the digital data stream with the first digital delta-sigma modulator loop-filter implementing the selected signal transfer function with an all pole filter response.

3. The method of processing of claim 1, further comprising filtering out-of-band noise generated by noise shaping in the first digital delta-sigma modulator with a filter.

4. The method of processing of claim 3, further comprising varying a sample rate of the digital data stream at the input of the first digital delta-sigma modulator to vary a corner frequency of the selected signal transfer function.

5. The method of processing of claim 3, Wherein the filter comprises the second digital-sigma modulator having an input driven with multiple-bit data from a multiple-bit quantizer of the first digital delta-signal modulator.

6. The method of processing of claim 1, further comprising increasing a sample rate of the digital stream being processed to shift quantization noise generated by the first digital delta-sigma modulator to a wider frequency band.

7. The method of processing of claim 1, further comprising:
quantizing the digital data stream being processed to a first number of bits with a multiple-bit quantizer of the first digital delta-sigma modulator; and
requantizing the digital data stream from the first number of bits to a second number of bits in the second digital delta-sigma modulator having an input driven by the multiple-bit quantizer of the first digital delta-sigma modulator, the second number of bits being less than the first number of bits.

8. A digital data processing system, comprising:
a first digital delta-sigma modulator having a signal transfer function selected to filter a stream of digital input data and a multiple-bit quantizer for outputting a stream of filtered multiple-bit digital date; and
a digital processing stage including a second digital delta-sigma modulator having an input driven by a multiple-bit filtered digital data output from the multiple-bit quantizer of the first digital delta-sigma modulator for processing the multiple-bit filtered digital data output from the first digital delta-sigma modulator.

9. The system of claim 8, wherein the signal transfer function of the first digital delta-sigma modulator corresponds to a low pass filter response.

10. The system of claim 8, wherein the signal transfer function of the first digital delta-sigma modulator corresponds to a high pass filter response.

11. The system of claim 8, wherein the second digital delta-sigma modulator has a noise transfer function for removing out-of-band noise output from the first digital delta-sigma modulator.

12. The system of claim 8, wherein the second digital delta-sigma modulator drives a digital to analog converter.

13. The system of claim 8, further comprising a zero-order hold stage at an input of the first digital delta-sigma modulator for selectively varying a corner frequency of the signal transfer function.

14. The system of claim 8, further comprising a zero-order hold at an output of the first digital delta-sigma modulator for increasing an output sample rate.

15. A delta-sigma modulation system, comprising:
a first digital delta-sigma modulator for noise shaping a received stream of digital data and having a multiple-bit quantizer and implementing a low pass signal transfer function; and
a digital filter for filtering out-of-band noise from a noise shaped output stream from the multiple-bit quantizer of the first digital delta-sigma modulator, the digital filter including a second digital delta-sigma modulator driven by the multiple-bit quantizer of the first digital delta-sigma modulator.

16. The delta-sigma modulation system of claim 15, wherein the first digital delta-sigma modulator performs a first quantization of a first number of bits and the second digital delta-sigma modulator performs a second quantization of a second number of bits, the second number of bits being smaller than the first number of bits.

17. The delta sigma modulation system of claim 15, further comprising circuitry for increasing a sample rate of the noise shaped output stream to shift the out-of-band noise to a higher frequency band.

18. A digital to analog converter, comprising:
a first digital delta-sigma modulator having a low pass signal transfer function and a multiple-bit quantizer for outputting data with a first quantization level of a first number of bits;
a second digital delta-sigma modulator receiving data of the first quantization level from the multiple-bit quantizer of the first digital delta-sigma modulator and having a noise transfer function for removing quantization noise output from the first digital delta-sigma modulator and outputting data with a second quantization level of a second number of bits; and
a digital to analog converter stage including a number of conversion elements corresponding to the second quantization level of the second number of bits.

19. The digital to analog converter of claim 18, further comprising a zero-order hold stage for increasing a sampling rate of a data stream being converted to translate the quantization noise output from the first digital delta-sigma modulator to a higher frequency band.

20. The digital to analog converter of claim 18, further comprising a dynamic element matching logic at an output of the second digital delta-sigma modulator for operating output data of the second quantization level of the second number of bits.

21. The digital to analog co of claim 18, further comprising a zero-order hold stage at an input of the first digital delta-sigma modulator for selectively varying a corner frequency of the low pass signal transfer function.

22. A delta-sigma modulator system, comprising:
a first digital delta-sigma modulator having a multiple-bit quantizer and a loop-filter for implementing a signal transfer function selected to remove noise from a signal passband;
circuitry for varying selected operating parameters of the loop-filter to vary characteristics of the signal transfer function; and
a digital processing stage including a second digital delta-sigma modulator having an input driven by a multiple-bit filtered digital data output from the multiple-bit quantizer of the first digital delta-sigma modulator for processing the multiple-bit filtered digital data output from the first digital delta-sigma modulator.

23. The delta-sigma modulator system of claim 22, wherein the circuitry for varying varies the selected operating parameters of the loop-filter to vary a corner frequency of the signal transfer function.

24. The delta-sigma modulator system of claim 23, wherein the circuitry for varying the selected operating parameters varies the corner frequency of the signal transfer function by varying an input data rate to the loop-filter of the first digital delta-sigma modulator.

25. The delta-sigma modulator system of claim 24, wherein the circuitry for varying the selected operating parameters comprises a zero-order hold stage.

26. The delta-sigma modulator system of claim 24, wherein the signal passband is a low frequency passband.

27. The delta-sigma modulator system of claim 24, wherein the signal passband comprises a high frequency passband.

28. The delta-sigma modulator system of claim 24, wherein the signal passband is a notch.

* * * * *